US008258821B2

(12) United States Patent
Dina et al.

(10) Patent No.: US 8,258,821 B2
(45) Date of Patent: Sep. 4, 2012

(54) MULTI-VOLTAGE INPUT BUFFER

(75) Inventors: Marius V. Dina, Inver Grove Heights, MN (US); Jeremy R. Kuehlwein, Woodbury, MN (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 12/959,142

(22) Filed: Dec. 2, 2010

(65) Prior Publication Data

US 2012/0139606 A1   Jun. 7, 2012

(51) Int. Cl.
*H03K 3/00* (2006.01)

(52) U.S. Cl. .......... 327/108; 327/333; 327/335; 326/64; 326/75

(58) Field of Classification Search .................. 326/63, 326/64, 68, 75, 80; 327/108–112, 318–319, 327/333, 335
See application file for complete search history.

(56) References Cited

U.S. PATENT DOCUMENTS

| 7,233,176 | B2 | 6/2007 | Sharma et al. |
| 7,619,459 | B2 * | 11/2009 | Ryan .............................. 327/333 |
| 2010/0097117 | A1 | 4/2010 | Wang et al. |

OTHER PUBLICATIONS

"Mixed-Voltage I/O Buffer Using 0.35 μm CMOS Technology," Proc. IEEE Int. Conf. Electron., Circuits Syst., Aug. 2008, pp. 850-853 (Tzung-Je Lee, Wei-Chih Chang and Chua-Chin Wang).

"1.8 V to 5.0 V Mixed-Voltage-Tolerant I/O Buffer With 54.59% Output Duty Cycle," IEEE International Symposium on VLSI Design, Automation and Test, Apr. 2008, pp. 93-96 (Tzung-Je Lee, Yi-Cheng Liu and Chua-Chin Wang).

"High-Voltage-Tolerant I/O Bufferswith Low-Voltage CMOS Process," IEEE Journal of Solid-State Circuits, vol. 34, No. 11, Nov. 1999, pp. 1512-1525 (Gajendra P. Singh, and Raoul B. Salem).

* cited by examiner

*Primary Examiner* — An Luu

(74) *Attorney, Agent, or Firm* — John J. Patti; Frederick J. Telecky, Jr.

(57) ABSTRACT

In hard disc drive (HDD) applications, there is often a need for input buffers that can operate at a variety of voltages (i.e., 1.8V, 2.5V, and 3.3V) as well as tolerate high voltages (i.e., 5V). Traditional buffers, however, usually lack the ability to operate at these varying voltages and lack the ability to tolerate high voltages. Here, a buffer is provided that fits this criteria through the use of a switching circuit and an anti-saturation circuit (as well as other circuitry).

20 Claims, 4 Drawing Sheets

| *FIG. 2A* | *FIG. 2B* |

MULTI-VOLTAGE INPUT BUFFER

TECHNICAL FIELD

The invention relates generally to an input buffer and, more particularly, to an input buffer that can operate at 1.8V, 2.5V, and 3.3V and that is 5V tolerant.

BACKGROUND

For conventional hard disk drive (HDD), the Read Channel usually has several specifications. First, the preamplifier input buffers should output a logic low or "0" when an input signal is less than about 0.682V and should output a logic high or "1" when the input signal is greater than about 1.086V. Additionally, the buffer should be able to tolerate input signals of at least 3.6V. Third, the buffer should be able to operate at speeds up to about 80 MHz, and, fourth, the buffer should use low power when outputting a logic low or "0."

Turning to FIG. 1, an example of a convention 1.8V input buffer 100 can be seen. Buffer 100 generally comprises PMOS transistors Q1 through Q3, NMOS transistor Q4, and inverter 102. In operation, an input signal VIN is applied to the gates of transistors Q1, Q2, and Q4, and as the input signal VIN is increased, the output signal VOUT remains at logic low or "0" until a an upper voltage (i.e., about 1.086V) is reached. Once reached, the buffer 100 outputs a logic high or "1." The buffer 100 continues to output a "1" until the input signal decreases to a lower voltage (i.e., about 0.682V) when the buffer 100 switches to a "0." Effectively, buffer 100 operates like a Schmitt trigger, having hysteresis between the upper voltage and the lower voltage.

There are, however, drawbacks to this configuration. With a supply voltage VCC of about 5V, a nominal threshold for a range between a lower voltage of about 0.682V and an upper voltage of about 1.086V would be about 0.884V. This would necessitate that transistor Q4 have an aspect ratio (channel width to channel length) that is much larger than that of transistors Q2 and Q3. This dramatic difference in aspect ratios may then result in a significant variance in the nominal threshold due at least in part to processes, temperature, and supply voltage variations. Additionally, because the pull-up available from transistors Q1 through Q3 for this configuration is very weak, the switching speed of buffer 100 can be significantly limited (i.e., 20 MHz).

Therefore, there is an need for an improved input buffer.

Some other conventional circuits are: U.S. Pat. No. 7,233,176; U.S. Patent Pre-Grant Publ. No. 2010/0097117; Lee et al., "Mixed-Voltage I/O Buffer Using 0.35 μm CMOS Technology," *Proc. IEEE Int. Conf. Electron., Circuits Syst.*, August 2008, pp. 850-853; Lee et al., "1.8 V to 5.0 V Mixed-Voltage-Tolerant I/O Buffer With 54.59% Output Duty Cycle," *IEEE International Symposium on VLSI Design, Automation and Test*, 2008, April 2008, pp. 93-96; Singh et al., "High-Voltage-Tolerant I/O Buffers With Low-Voltage CMOS Process," *IEEE J. of Solid-State Circuits*, Vol. 34, No. 11, November 1999, pp. 1512-1525.

SUMMARY

A preferred embodiment of the present invention, accordingly, provides an apparatus. The apparatus comprises a reference circuit; a level shifter that receives an input signal; a bipolar differential pair that is coupled to the reference circuit and the level shifter; a tail current source that is coupled to the bipolar differential pair, wherein the tail current sources a first current when the input signal is less than a first threshold; a switching circuit having a plurality of current branches, wherein each current branch is coupled to the bipolar differential pair, and wherein a first current branch of the plurality of current branches receives the input voltage, and wherein a first current branch is activated when the input signal become greater than the first threshold so as to source a second current through the differential bipolar pair, and wherein a second current branch of the plurality of current branches mirrors the second current when the input signal becomes greater than a second threshold, and wherein the first current branch is deactivated when the input signal becomes greater than a second threshold; and an output circuit that is coupled to the switching circuit.

In accordance with a preferred embodiment of the present invention, the switching circuit further comprises: a first inverter that is coupled to the second current branch; and a third inverter that is coupled to the first inverter and the first current branch.

In accordance with a preferred embodiment of the present invention, the switching circuit further comprises a third current branch of the plurality of current branches that is coupled to the bipolar differential input pair and that is controlled by the first inverter.

In accordance with a preferred embodiment of the present invention, the first current branch further comprises: a resistor that is coupled to the bipolar differential input pair; a first NMOS transistor that is coupled to the resistor at its drain and that receives the input signal at its gate; and a second NMOS transistor that is coupled to the source of the first NMOS transistor at its drain, ground at its source, and the second inverter at its gate.

In accordance with a preferred embodiment of the present invention, the second current branch further comprises: a bipolar current mirror that is coupled to the bipolar differential input pair; a first CMOS current mirror that is coupled to the bipolar differential input pair and to the first inverter; and a second CMOS current mirror that is coupled to the bipolar current mirror and the first CMOS current mirror.

In accordance with a preferred embodiment of the present invention, the output circuit further comprises a third inverter that is coupled to the second inverter.

In accordance with a preferred embodiment of the present invention, the apparatus further comprises an anti-saturation circuit that is coupled between the level shifter and the bipolar differential pair.

In accordance with a preferred embodiment of the present invention, the anti-saturation circuit further comprises an NMOS transistor that is coupled to the level shifter at its drain, the differential bipolar pair at its source, and ground at its body.

In accordance with a preferred embodiment of the present invention, a method is provided. The method comprises level shifting an input signal; providing a level shifted input signal to a bipolar differential pair; sourcing a first current through the bipolar differential pair by a tail current source when the input signal is less than a first threshold; activating a first current branch of a switching circuit when the input signal become greater than the first threshold so as to source a second current through the differential bipolar pair; mirroring the second current with a second current branch of the switching circuit when the input signal becomes greater than a second threshold; deactivating the current branch after an interval circuit when the input signal becomes greater than a second threshold; outputting a first voltage from an output circuit that is coupled to the switching circuit when the input signal is less than the second threshold; and outputting a second voltage from the output circuit when the input signal is greater than the second threshold.

In accordance with a preferred embodiment of the present invention, the step of activating further comprises activating a first NMOS transistor of the first current branch when the input voltage reaches the first threshold so as to source second current through the differential bipolar pair.

In accordance with a preferred embodiment of the present invention, the method further comprises increasing a resistance applied to the level shifted input voltage as the level shifted input voltage approached a third threshold.

In accordance with a preferred embodiment of the present invention, the first threshold is about 0.6V, and wherein the second threshold is about 0.88V, and wherein the third threshold is about 4V.

In accordance with a preferred embodiment of the present invention, an apparatus is provided. The apparatus comprises a reference circuit; a level shifter that receives an input signal; an anti-saturation circuit that is coupled to the level shifter; a bipolar differential pair having: a first NPN transistor that is coupled to the anti-saturation circuit at its base; and a second NPN transistor that is coupled to the emitter of the first NPN transistor at its emitter and that is coupled to the reference circuit at its base; a tail current source that is coupled to the emitters of the first and second NPN transistors and that is coupled to the reference circuit; a switching circuit having: a current branch that is coupled to the emitters of the first and second NPN transistors and that receives the input signal, wherein the current branch is activated when the input signal become greater than a first threshold; a bipolar current mirror that is coupled to the collector of the first NPN transistor; a first CMOS current mirror that is coupled to the collector of the second NPN transistor; a second CMOS current mirror that is coupled to the bipolar current mirror and the first CMOS current mirror; and a plurality of inverters that are coupled in series with one another, wherein a first inverter of the plurality of inverters is coupled to the a node between the first and second CMOS current mirrors, and wherein a second inverter of the plurality of inverters is coupled to the current branch, and wherein the second inverter deactivates the current branch when the input signal becomes greater than a second threshold; and an output circuit that is coupled to the second inverter.

In accordance with a preferred embodiment of the present invention, the resistor further comprises a first resistor, and wherein the reference circuit further comprises: a current source that is coupled to the base of the second NPN transistor; a second resistor that is coupled to the current source; and a PNP transistor that is coupled to the resistor, wherein the PNP transistor is dioded-connected.

In accordance with a preferred embodiment of the present invention, the tail current source further comprises a third NMOS transistor that is coupled to the emitters of the first and second NPN transistors at its drain and the current source at its gate.

In accordance with a preferred embodiment of the present invention, the PNP transistor further comprises a first PNP transistor, and wherein the current source further comprises a first current source, and wherein the switching circuit further comprises: a second PNP transistor that is diode-connected; a second current source that is coupled to the collector and base of the second PNP transistor; a switch that is coupled to the collector and base of the second PNP transistor and that is controlled by the first inverter; a third PNP transistor that is coupled to the switch at its base; a third CMOS current mirror that is coupled to the collector of the third PNP transistor and the emitters of the first and second NPN transistors.

In accordance with a preferred embodiment of the present invention, the anti-saturation circuit further comprises a fourth NMOS transistor that is coupled to the level shifter at its drain, the base of the first NPN transistor at its source, and ground at its body.

In accordance with a preferred embodiment of the present invention, the first threshold is about 0.6V, and wherein the second threshold is about 0.88V, and wherein the third NMOS transistor sources about 1 µA when the input signal is less than about 0.6V.

In accordance with a preferred embodiment of the present invention, the current branch sources about 200 µA when activated.

In accordance with another preferred embodiment of the present invention,

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figures 1, 2:
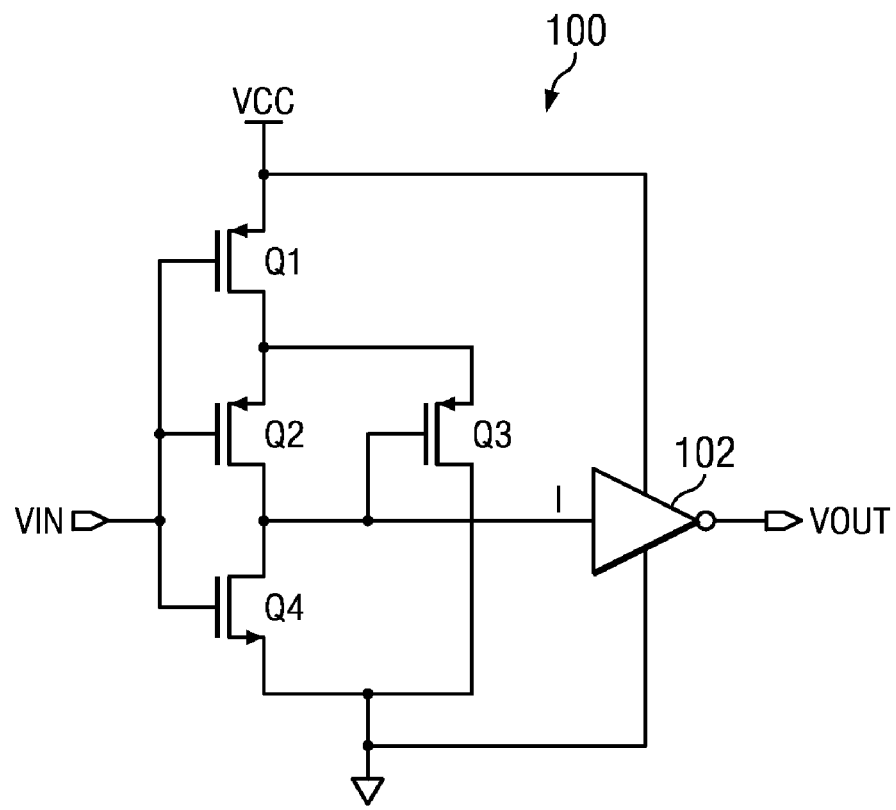
FIG. 1 is a diagram of an example of a conventional input buffer.
FIG. 2 is a diagram of an example of an input buffer in accordance with a preferred embodiment of the present invention.
Figure 2A:
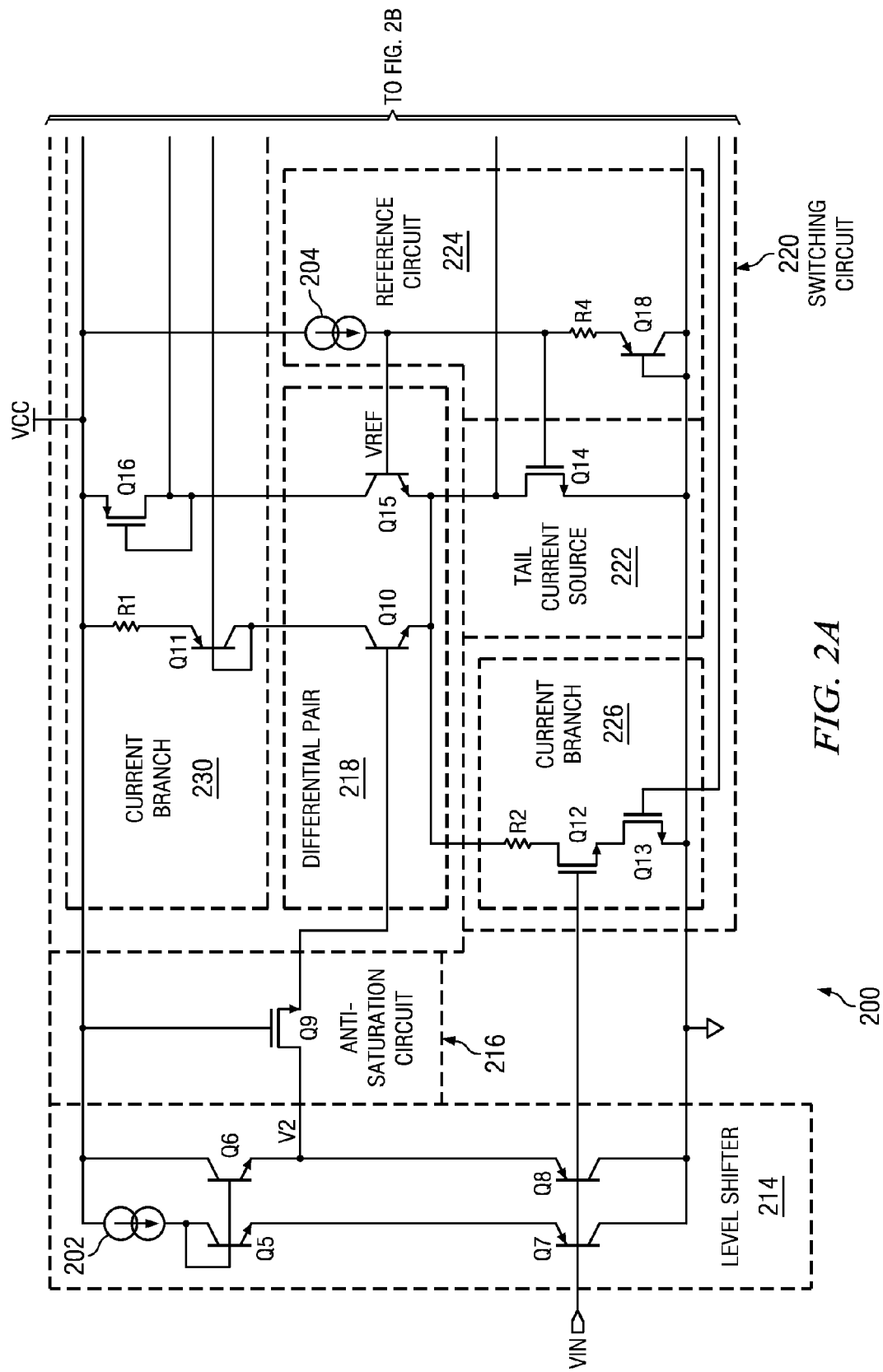
Figure 2B:
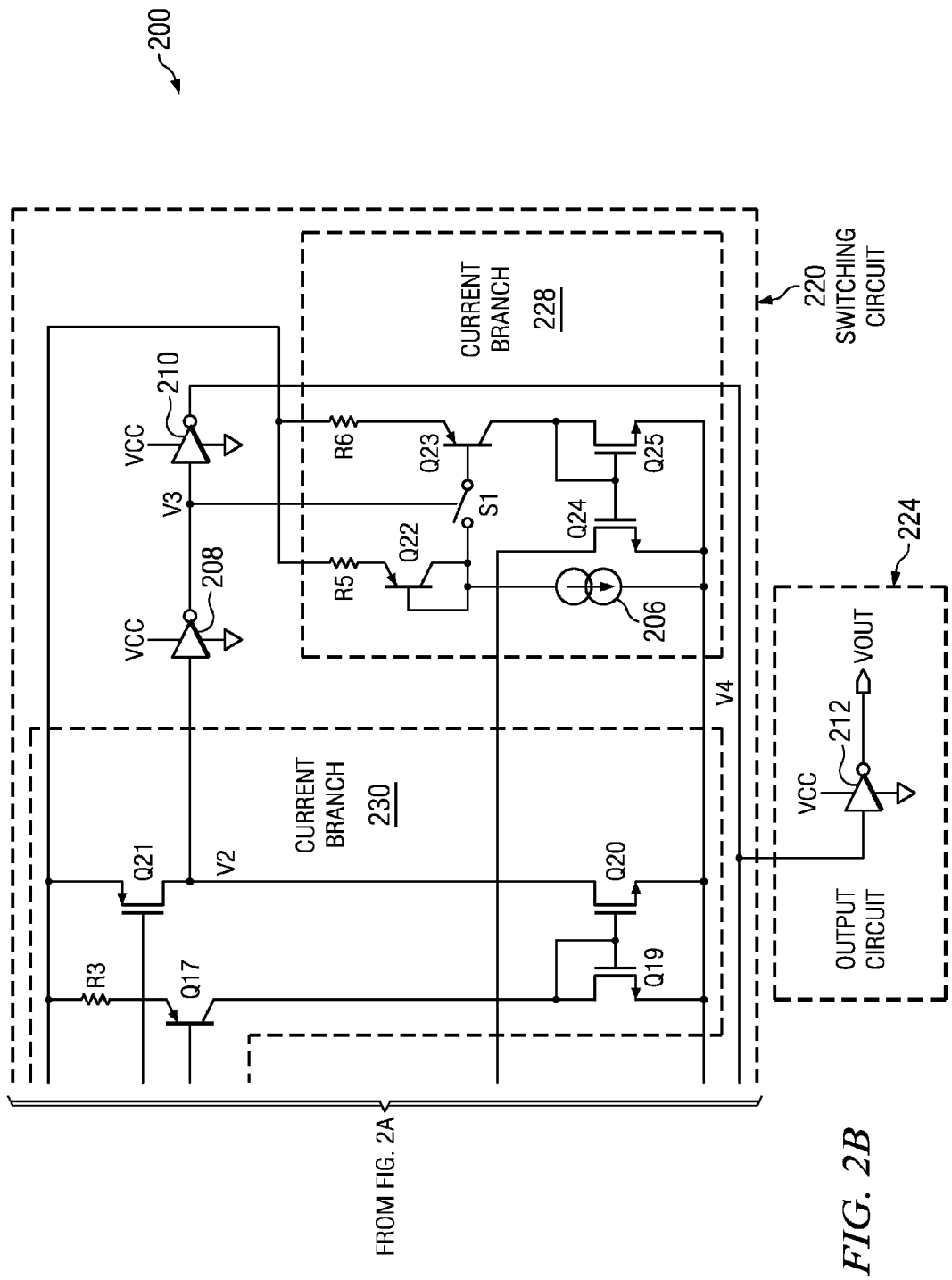
Figure 3:
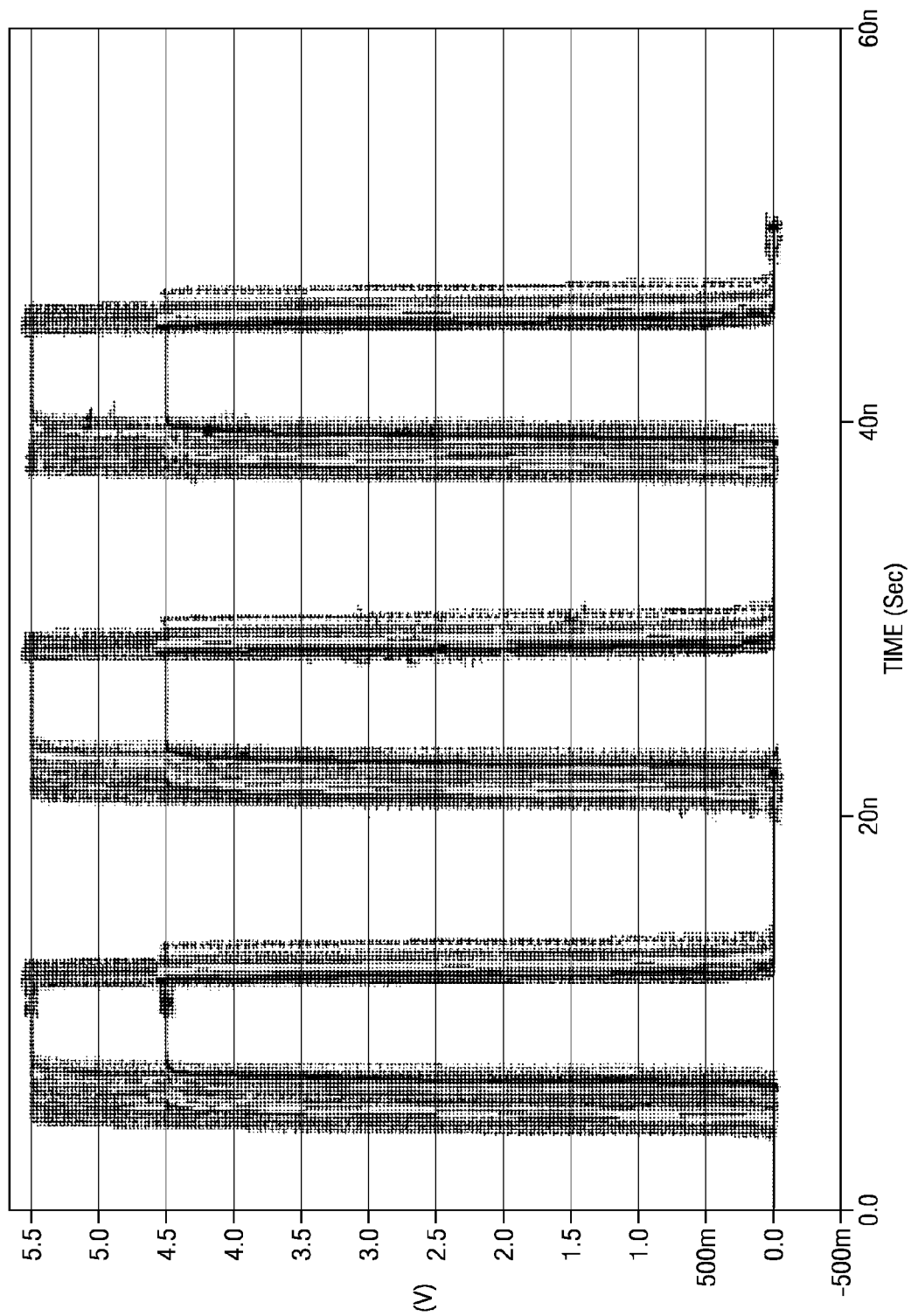
FIG. 3 is a diagram depicting the operation of the input buffer of FIG. 4.

Refer now to the drawings wherein depicted elements are, for the sake of clarity, not necessarily shown to scale and wherein like or similar elements are designated by the same reference numeral through the several views.

Turning to FIG. 2, an example of an input buffer 200 in accordance with a preferred embodiment of the present invention can be seen. As shown, the input buffer 200 generally comprises a level shifter 214, an anti-saturation circuit 216, a bipolar differential pair 218 a switching circuit 220, a tail current source 222, reference circuit 224, and an output circuit 224. The switching circuit 220 generally comprises current branches 226, 228, and 230, and inverters 208 and 210, and output circuit 212 generally comprises inverter 212. Additionally, the reference circuit 224 generally comprises a current source 204, resistor R4, and transistor Q18 (which can, for example, be a diode-connected PNP transistor).

Typically, the input signal VIN is provided to the level shifter 214 for application to differential pair 218. The input signal VIN is provided to transistors Q7 and Q8 (which can, for example, be PNP transistors). A current source (which can be an "absolute" current that is independent of process and temperature) provides a current to the steering transistor of current mirror Q6/Q6 (which can, for example, be NPN transistors and which are generally coupled to transistors Q7 and Q8). This allows the input signal VIN to be shifted by one base-emitter voltage ($V_{BE}$) and provides headroom for current branch 228 (which is described below).

The level shifted input voltage V1 can then be provided to the anti-saturation circuit 216, which can generally prevents transistor Q10 (which can, for example, be an NPN transistor) from saturating. The anti-saturation circuit 216 is generally comprised of transistors Q9 (which can, for example, be an NMOS transistor) that received the supply voltage VCC at its gate and is coupled between the level shifter 214 and base of transistor Q10. Assuming that the supply voltage VCC is about 5V and assuming that the anti-saturation circuit 216 has been removed, transistor Q10 would become saturated when the input voltage VIN is greater than 3.6V, which would be undesirable for latch-up and speed considerations. In part, because the body of the transistor Q9 is grounded, the resistance of transistor Q9 dramatically increases as the input signal VIN becomes large such that the base current of transistor Q10 develops a voltage drop across transistor Q9. For example, with a supply voltage VCC of about 5V and as the input voltage VIN approaches 4V, the resistance of transistor Q9 increases such that the voltage drop is about 400 mV. Thus, the addition of anti-saturation circuit 216 allow the buffer 100 to be high voltage (i.e., 5V) tolerant.

In operation, the input signal VIN is also provided to switching circuit 220 to provides a hysteresis loop; namely, the input signal VIN is provided to the gate of transistor Q12 of current branch 226. When the input signal VIN is less than a lower threshold (i.e., about 0.6V), transistor Q12 is "off." Normally, without any additional current sources, current branch 226 being "off" would result in transistor Q15 (which can, for example, be an NPN transistor) of differential pair 218 and transistors Q16 and Q21 (which can, for example, NMOS transistors and which can form an NMOS current mirror) being "off" or deactivated. To maintain transistors Q15, Q16 and Q21 in an "on" or active state, tail current source 222 sources a small current (i.e., about 1 µA) when the input signal is less than the lower threshold (i.e., about 0.6V). This tail current source 222 is generally comprised of a transistor Q14 (which can, for example, be an NMOS transistor with a small aspect ratio) that receives a reference voltage VREF (which may be the base-emitter voltage of transistor Q18 plus 0.88V) from reference circuit 224. Additionally, to allow the tail current source 222 to source the small current, the reference voltage VREF can also be applied to the base of transistor Q15. When the input signal VIN slews and reaches the lower threshold (i.e., about 0.6V), transistor Q12 is switched "on" or activated, and, because the voltage V4 is approximately the supply voltage VCC (i.e., about 5V), current branch 226 sources a larger current (which can, for example, be 200 µA) through transistor Q15. The larger current causes a "hard turn-on" of transistor Q21. Once the input signal VIN becomes greater than an upper threshold (i.e., about 0.88V), transistor Q10 is activated so that bipolar current mirror Q11/Q17 (which can, for example, be PNP transistors), resistors R1 and R3, and CMOS current mirrors Q16/Q21 and Q19/Q20 can source the larger current (i.e., about 200 µA) that was sourced by the current branch 226. This cause voltage V2 to drop, inverter 208 to turn "on," and inverter 210 to turn "off." The "off" state of inverter 210, then turns "off" transistor Q13, which deactivates current branch 226. Thus, the output signal VOUT from inverter 212 remains at ground or 0V until after the upper threshold (i.e., about 0.88V) is reached at which time the output signal becomes the supply voltage VCC (i.e., 5V).

Also, included within the switching circuit 220 is current branch 228, which can be used for negative transitions. Current branch 228 generally comprises a bipolar current mirror Q22/Q23 (which can, for example, be PNP transistors) that is coupled to resistors R5 and R6 and that includes a switch Si that is controlled by voltage V3. Voltage V3 generally increases to the supply voltage VCC once the upper threshold has been reached by the input signal VIN. When switch Si is closed, current source 206 provides a steering current for transistor Q22. This steering current (which may be about 200 µA) is mirrored by CMOS current mirror Q24/Q25 (which can, for example, be NMOS transistors and which is generally coupled to the emitters of transistors Q10 and Q15). When the input signal VIN transitions from the upper voltage or threshold (i.e., about 1.086V) to a lower voltage or threshold (i.e., about 0.68V), the current from transistor Q24 can be used to quickly slew transistor Q21 so as to pull voltage V2 high (i.e., to the supply voltage VCC).

Turning now to FIG. 7, an example of the operation of buffer can be seen. Here, transitions can be seen for supply voltages of about 4.5V and about 5.5V.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a reference circuit;
   a level shifter that receives an input signal;
   a bipolar differential pair that is coupled to the reference circuit and the level shifter;
   a tail current source that is coupled to the bipolar differential pair, wherein the tail current sources a first current when the input signal is less than a first threshold;
   a switching circuit having a plurality of current branches, wherein each current branch is coupled to the bipolar differential pair, and wherein a first current branch of the plurality of current branches receives the input voltage, and wherein a first current branch is activated when the input signal become greater than the first threshold so as to source a second current through the differential bipolar pair, and wherein a second current branch of the plurality of current branches mirrors the second current when the input signal becomes greater than a second threshold, and wherein the first current branch is deactivated when the input signal becomes greater than a second threshold; and
   an output circuit that is coupled to the switching circuit.

2. The apparatus of claim 1, wherein the switching circuit further comprises:
   a first inverter that is coupled to the second current branch; and
   a third inverter that is coupled to the first inverter and the first current branch.

3. The apparatus of claim 2, wherein the switching circuit further comprises a third current branch of the plurality of current branches that is coupled to the bipolar differential input pair and that is controlled by the first inverter.

4. The apparatus of claim 1, wherein the first current branch further comprises:
   a resistor that is coupled to the bipolar differential input pair;
   a first NMOS transistor that is coupled to the resistor at its drain and that receives the input signal at its gate; and
   a second NMOS transistor that is coupled to the source of the first NMOS transistor at its drain, ground at its source, and the second inverter at its gate.

5. The apparatus of claim 4, wherein the second current branch further comprises:
   a bipolar current mirror that is coupled to the bipolar differential input pair;

a first CMOS current mirror that is coupled to the bipolar differential input pair and to the first inverter; and
a second CMOS current mirror that is coupled to the bipolar current mirror and the first CMOS current mirror.

6. The apparatus of claim 5, wherein the output circuit further comprises a third inverter that is coupled to the second inverter.

7. The apparatus of claim 1, wherein the apparatus further comprises an anti-saturation circuit that is coupled between the level shifter and the bipolar differential pair.

8. The apparatus of claim 7, wherein the anti-saturation circuit further comprises an NMOS transistor that is coupled to the level shifter at its drain, the differential bipolar pair at its source, and ground at its body.

9. A method comprising:
level shifting an input signal;
providing a level shifted input signal to a bipolar differential pair;
sourcing a first current through the bipolar differential pair by a tail current source when the input signal is less than a first threshold;
activating a first current branch of a switching circuit when the input signal become greater than the first threshold so as to source a second current through the differential bipolar pair;
mirroring the second current with a second current branch of the switching circuit when the input signal becomes greater than a second threshold;
deactivating the current branch after an interval circuit when the input signal becomes greater than a second threshold;
outputting a first voltage from an output circuit that is coupled to the switching circuit when the input signal is less than the second threshold; and
outputting a second voltage from the output circuit when the input signal is greater than the second threshold.

10. The method of claim 9, wherein the step of activating further comprises activating a first NMOS transistor of the first current branch when the input voltage reaches the first threshold so as to source second current through the differential bipolar pair.

11. The method of claim 10, wherein the method further comprises increasing a resistance applied to the level shifted input voltage as the level shifted input voltage approached a third threshold.

12. The method of claim 11, wherein the first threshold is about 0.6V, and wherein the second threshold is about 0.88V, and wherein the third threshold is about 4V.

13. An apparatus comprising:
a reference circuit;
a level shifter that receives an input signal;
an anti-saturation circuit that is coupled to the level shifter;
a bipolar differential pair having:
a first NPN transistor that is coupled to the anti-saturation circuit at its base; and
a second NPN transistor that is coupled to the emitter of the first NPN transistor at its emitter and that is coupled to the reference circuit at its base;
a tail current source that is coupled to the emitters of the first and second NPN transistors and that is coupled to the reference circuit;
a switching circuit having:
a current branch that is coupled to the emitters of the first and second NPN transistors and that receives the input signal, wherein the current branch is activated when the input signal become greater than a first threshold;
a bipolar current mirror that is coupled to the collector of the first NPN transistor;
a first CMOS current mirror that is coupled to the collector of the second NPN transistor;
a second CMOS current mirror that is coupled to the bipolar current mirror and the first CMOS current mirror; and
a plurality of inverters that are coupled in series with one another, wherein a first inverter of the plurality of inverters is coupled to the a node between the first and second CMOS current mirrors, and wherein a second inverter of the plurality of inverters is coupled to the current branch, and wherein the second inverter deactivates the current branch when the input signal becomes greater than a second threshold; and
an output circuit that is coupled to the second inverter.

14. The apparatus of claim 13, wherein the first current branch further comprises:
a resistor that is coupled to the bipolar differential input pair;
a first NMOS transistor that is coupled to the resistor at its drain and that receives the input signal at its gate; and
a second NMOS transistor that is coupled to the source of the first NMOS transistor at its drain, ground at its source, and the second inverter at its gate.

15. The apparatus of claim 14, wherein the resistor further comprises a first resistor, and wherein the reference circuit further comprises:
a current source that is coupled to the base of the second NPN transistor;
a second resistor that is coupled to the current source; and
a PNP transistor that is coupled to the resistor, wherein the PNP transistor is dioded-connected.

16. The apparatus of claim 15, wherein the tail current source further comprises a third NMOS transistor that is coupled to the emitters of the first and second NPN transistors at its drain and the current source at its gate.

17. The apparatus of claim 16, wherein the PNP transistor further comprises a first PNP transistor, and wherein the current source further comprises a first current source, and wherein the switching circuit further comprises:
a second PNP transistor that is diode-connected;
a second current source that is coupled to the collector and base of the second PNP transistor;
a switch that is coupled to the collector and base of the second PNP transistor and that is controlled by the first inverter;
a third PNP transistor that is coupled to the switch at its base;
a third CMOS current mirror that is coupled to the collector of the third PNP transistor and the emitters of the first and second NPN transistors.

18. The apparatus of claim 17, wherein the anti-saturation circuit further comprises a fourth NMOS transistor that is coupled to the level shifter at its drain, the base of the first NPN transistor at its source, and ground at its body.

19. The apparatus of claim 18, wherein the first threshold is about 0.6V, and wherein the second threshold is about 0.88V, and wherein the third NMOS transistor sources about 1 µA when the input signal is less than 0.6V.

20. The apparatus of claim 19, wherein the current branch sources about 200 µA when activated.

* * * * *